United States Patent
Chou et al.

(10) Patent No.: US 6,992,010 B2
(45) Date of Patent: Jan. 31, 2006

(54) GATE STRUCTURE AND METHOD OF MANUFACTURE

(75) Inventors: Pao-Haw Chou, Taipei (TW); Fumihiko Inoue, Yokohama (JP); Toshiro Nakanishi, Yokohama (JP); Yoshio Ozawa, Yokohama (JP)

(73) Assignee: Winbond Electronics Corp., Hsinchu (TW)

( * ) Notice: Subject to any disclaimer, the term of this patent is extended or adjusted under 35 U.S.C. 154(b) by 249 days.

(21) Appl. No.: 10/248,871

(22) Filed: Feb. 26, 2003

(65) Prior Publication Data

US 2003/0228766 A1    Dec. 11, 2003

(30) Foreign Application Priority Data

Jun. 6, 2002    (TW) .............................. 91112174 A

(51) Int. Cl.
*H01L 21/311*    (2006.01)
(52) U.S. Cl. .................. 438/694; 438/700; 438/706
(58) Field of Classification Search ........... 438/694, 438/700, 702, 706, 710, 719, 720, 723, 724, 438/745, 753, 756
See application file for complete search history.

(56) References Cited

U.S. PATENT DOCUMENTS

| | | | | |
|---|---|---|---|---|
| 5,620,912 A | * | 4/1997 | Hwang et al. | 438/301 |
| 5,972,762 A | * | 10/1999 | Wu | 438/305 |
| 6,107,157 A | * | 8/2000 | Fazan et al. | 438/424 |
| 6,143,611 A | * | 11/2000 | Gilton et al. | 438/279 |
| 6,190,996 B1 | * | 2/2001 | Mouli et al. | 438/400 |
| 6,838,365 B2 | * | 1/2005 | Gilton et al. | 438/585 |

* cited by examiner

Primary Examiner—Kin-Chan Chen
(74) Attorney, Agent, or Firm—Jianq Chyun IP Office

(57) ABSTRACT

A method of forming a gate structure. A gate oxide layer, a polysilicon layer, a metallic layer and an insulation layer are sequentially formed over a substrate. Using a definite height level to be an etching end point, the insulation layer, the metallic layer and the polysilicon layer are patterned to form a stack structure. A barrier layer is formed over the stack structure. An etching operation is conducted to form a first spacer covering a portion of each sidewall of the stack structure. The etching operation is continued to remove the polysilicon layer outside the first spacer until the gate oxide layer is exposed. A portion of the exposed polysilicon layer on the sidewalls of the stack structure is removed so that a recess structure is formed. A re-oxidation process is conducted to form a re-oxidation layer within the recess structure. A second spacer is formed over the first spacer and the re-oxidation layer.

7 Claims, 6 Drawing Sheets

GATE STRUCTURE AND METHOD OF MANUFACTURE

CROSS REFERENCE TO RELATED APPLICATIONS

This application claims the priority benefit of Taiwan application serial no. 91112174, filed Jun. 06, 2002.

BACKGROUND OF INVENTION

1. Field of Invention

The present invention relates to a semiconductor device structure and its method of manufacture. More particularly, the present invention relates to a polysilicon metal gate structure and its method of manufacture.

2. Description of Related Art

As the level of integration of semiconductor devices continues to increase, dynamic random access memory (DRAM) having gigabyte storage capacity is routinely manufactured. To reduce resistance-capacitance (RC) delay in a device gate, a polysilicon metal gate having a stacked structure has been employed. A polysilicon metal gate has a structural design that includes a refractory metal layer, a barrier metal layer and a polysilicon layer. For example, compared with a refractory metal layer made of tungsten, a polysilicon metal gate made of tungsten silicide ($WSi_x$) is much better at reducing the sheet resistance of the polysilicon metal gate. Furthermore, the gate is fabricated through a dry etching operation in a reactive ion etching (RIE) operation. Since a polysilicon metal gate has a smaller aspect ratio than a polycide metal gate, fabrication of self-aligned contacts is easier.

In general, a re-oxidation process is conducted after the gate is formed so that reliability of the gate oxide layer within the gate is improved and any damages to its internal structure during dry etching are repaired. However, the refractory metal layer (tungsten) is easily oxidized into tungsten oxide at the temperature level required for the re-oxidation process. Tungsten oxide is an insulating material so that resistance of the gate will increase and ultimately affect gate performance. To reduce tungsten oxidation, a selective oxidation process is used. Selective oxidation permits oxidation of exposed silicon surfaces without oxidizing the metal in an exposed metallic layer. Nevertheless, selective oxidation requires a high reactive temperature and hence results in a high thermal budget. Attempts to reduce thermal budget include forming a cap layer such as a silicon nitride layer over the gate structure prior to re-oxidation. The cap layer encloses the gate structure such that only the gate oxide layer is exposed. However, forming a silicon nitride layer over the gate structure means that the polysilicon layer is entirely enclosed by the silicon nitride and re-oxidation reaction at the gate corners is particularly difficult.

An alternative method for resolving the problems due to re-oxidation is to enclose the gate structure with a cap layer but expose the polysilicon layer on each side of the gate. This facilitates the re-oxidation at the corners of the gate. Yet exposing the polysilicon layer on each side of the gate structure and carrying out a re-oxidation process may produce a thick silicon oxide layer attached to the polysilicon sidewall. In the memory cell array of a dynamic random access memory (DRAM), an increase in thickness at the gate sidewall will reduce the outer diameter of subsequently formed contact openings. Such reduction in diameter renders the deposition of conductive material into contact openings increasingly difficult.

SUMMARY OF INVENTION

Accordingly, one object of the present invention is to provide a gate structure and its method of manufacture that permits re-oxidation of gate corners. Hence, stability and reliability of the gate oxide layer within the gate structure is improved.

A second object of this invention is to provide a gate structure and its method of manufacture such that width of the gate remains unchanged after a re-oxidation process. Hence, there is no reduction in the width of subsequently formed contact openings.

To achieve these and other advantages and in accordance with the purpose of the invention, as embodied and broadly described herein, the invention provides a method of forming a gate structure. First, a gate oxide layer, a polysilicon layer, a metallic layer and an insulation layer are sequentially formed over a substrate. Using a definite height level of the polysilicon layer as an etching end point, the insulation layer, the metallic layer and the polysilicon layer are patterned to form a stack structure. Thereafter, a barrier layer is formed over the stack structure. An etching operation is conducted to form a first spacer covering a portion of the sidewall of the stack structure. The etching operation is continued to remove the polysilicon layer outside the first spacer until both the gate oxide layer as well as the polysilicon layer on the sidewalls of the stack structure are exposed. A portion of the exposed polysilicon layer on the sidewalls of the stack structure is removed so that a recess structure is formed on the sidewall of the stack structure. A re-oxidation process is conducted to form a re-oxidation layer within each recess structure. Finally, a second spacer is formed over the first spacer and the re-oxidation layer.

This invention also provides a gate structure comprising a substrate, a gate oxide layer, a polysilicon layer, a metallic layer, an insulation layer, a first spacer, a re-oxidation layer and a second spacer. The gate oxide layer, the polysilicon layer, the metallic layer and the insulation layer are stacked in sequence over the substrate. The polysilicon layer, the metallic layer and the insulation layer together form a stack structure. The re-oxidation layer is formed on the polysilicon layer at the junction between the polysilicon layer and the gate oxide layer. The first spacer is formed over the sidewall in that portion of the stack structure having no attached re-oxidation layer. The second spacer is formed over the first spacer and the re-oxidation layer.

Since the junctions between the gate corners and gate oxide layer are exposed before a re-oxidation process is conducted in this invention, junction areas between the gate corners and the gate oxide layer can be re-oxidized. Hence, stability and reliability of the gate oxide layer is improved.

Furthermore, because the exposed polysilicon layer on each sidewall of the gate structure is removed to form a recess structure prior to conducting the re-oxidation process, the re-oxidation layer is formed inside the recess structure without increasing overall width of the sidewalls. Hence, the gate and the subsequently formed contact opening have a constant width.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1A:
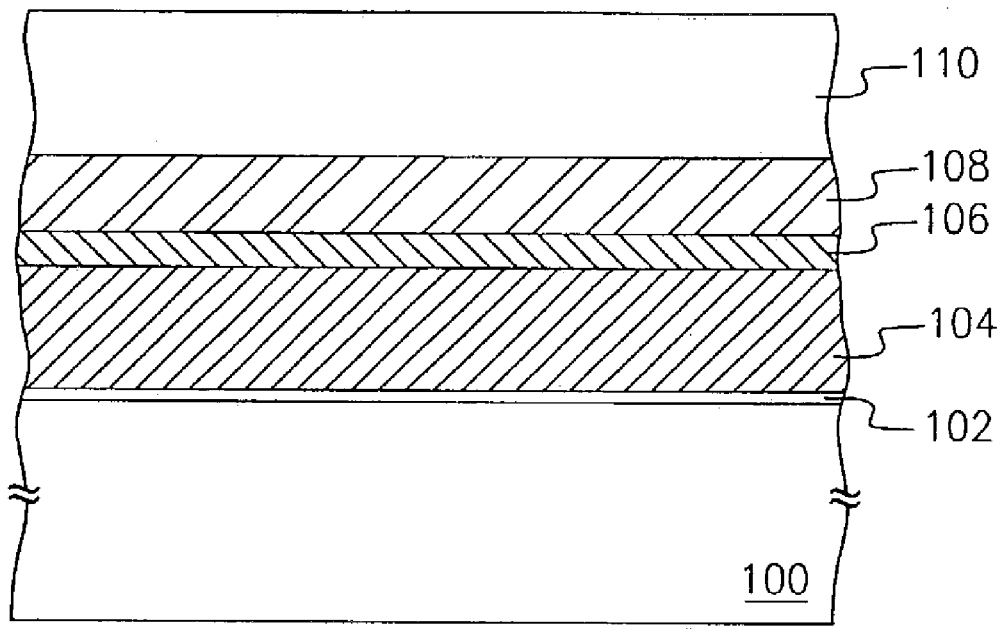
FIGS. 1A through 1G are schematic cross-sectional views showing the progression of steps for forming a gate structure according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1G are schematic cross-sectional views showing the progression of steps for forming a gate structure according to one preferred embodiment of this invention. As shown in FIG. 1A, a gate oxide layer 102, a polysilicon layer 104, a first metallic layer 106, a second metallic layer 108 and an insulation layer 110 are sequentially formed over a substrate 100. The gate oxide layer is formed, for example, by thermal oxidation. The polysilicon layer 104 is formed, for example, by chemical vapor deposition. The first metallic layer 106 serves as a barrier layer. The first metallic layer 106 is made from titanium nitride or tungsten nitride, for example. The second metallic layer 108 is made from a refractory metal such as tungsten. The metallic layer 108 is formed, for example, by chemical vapor deposition. The insulation layer 110 made, for example, from silicon nitride is formed by chemical vapor deposition. The first metallic layer 106 and the second metallic layer 108 together may be regarded as a stacked metallic layer.

Figure 1B:
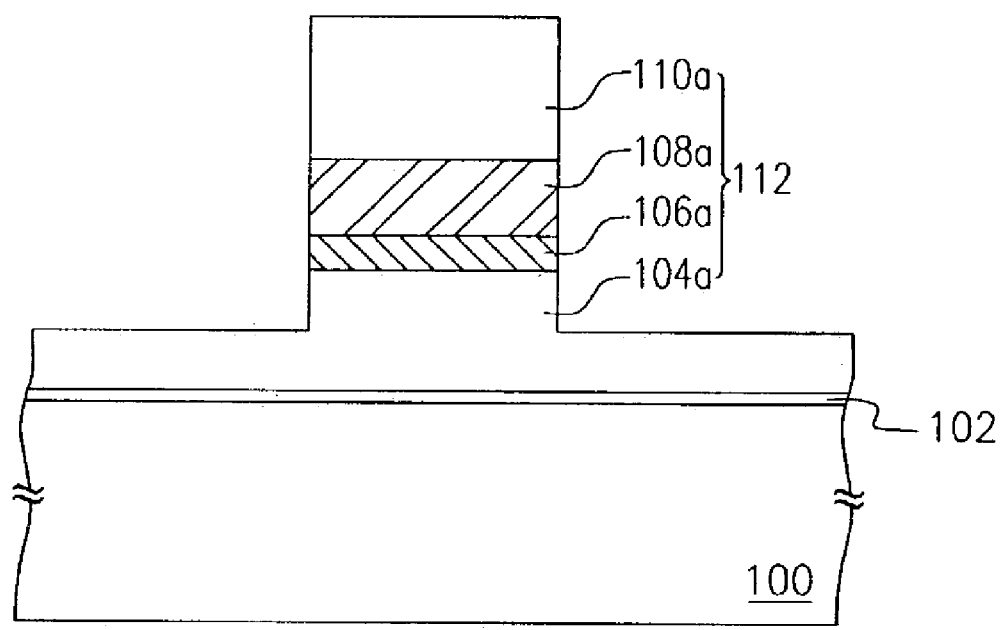

As shown in FIG. 1B, the insulation layer 110, the second metallic layer 108, the first metallic layer 106 and the polysilicon layer 104 are sequentially patterned to form a stack structure 112 over the substrate 100 comprising a polysilicon layer 104a, a first metallic layer 106a, a second metallic layer 108a and an insulation layer 110a. The stack structure 112 is formed, for example, by forming a patterned photoresist layer (not shown) over the insulation layer 110 and using the photoresist layer as an etching mask to etch the insulation layer 110, the metallic layer 108, the metallic layer 106 and the polysilicon layer 104 anisotropically. The etching stops when an etching end point is reached. In other words, the polysilicon layer 104 has reached a defined height level intermediate between the gate oxide layer 102 and the upper surface of the polysilicon layer 104.

Figure 1C:
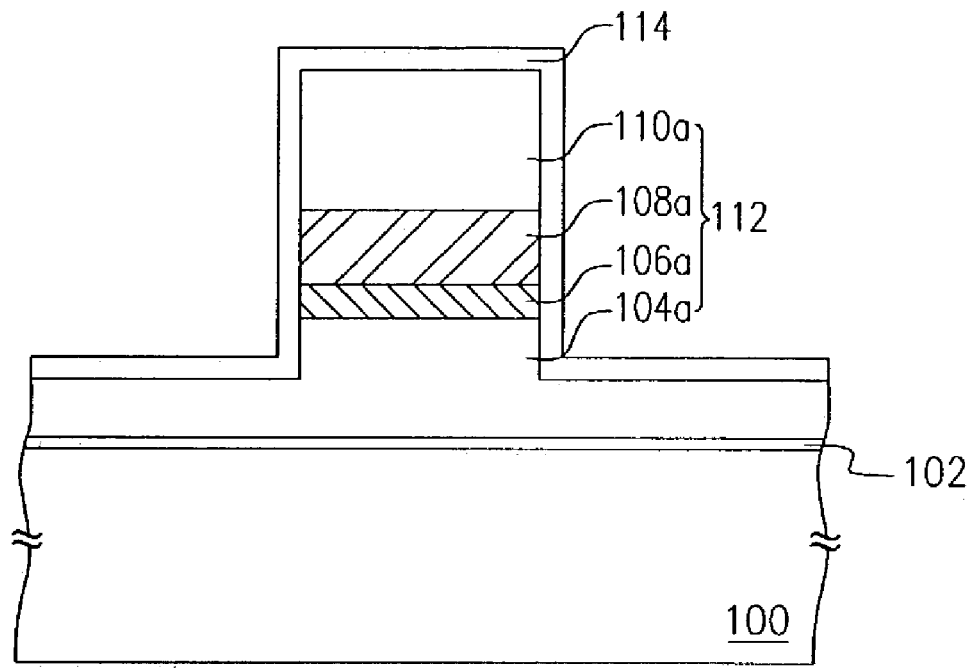

As shown in FIG. 1C, the photoresist layer (not shown) is removed. A conformal barrier layer 114 is formed over the stack structure 112. The barrier layer can be a silicon nitride (SiN) layer, a silicon boron nitride (SiBN) layer or a silicon oxynitride (SiON) layer formed, for example, by chemical vapor deposition.

Figure 1D:
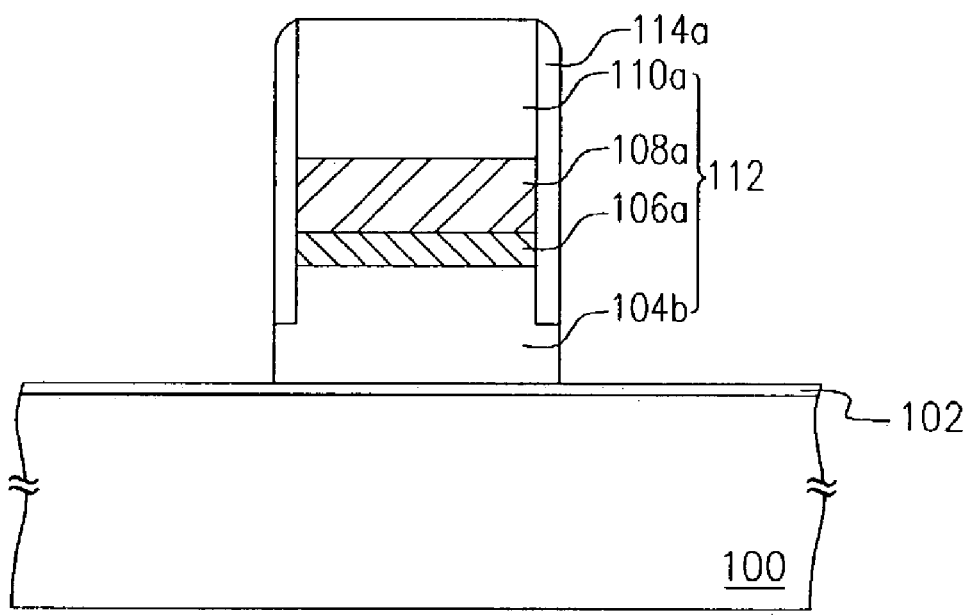

As shown in FIG. 1D, using the insulation layer 110a of the stack structure 112 and the barrier layer 114 enclosing the outer edges of the insulation layer 110a as a mask, an anisotropic etching is conducted to remove a portion of the barrier layer 114 and form spacers 114a. Thereafter, the anisotropic etching is continued to remove the polysilicon layer 104a outside the spacers 114a until the gate oxide layer 102 is exposed and form a polysilicon layer 104b. The stack structure 112 now comprises of the polysilicon layer 104b, the metallic layer 106a, the metallic layer 108a and the insulation layer 110a and exposes the polysilicon layer 104b on the sidewall of the stack structure 112.

Figure 1E:
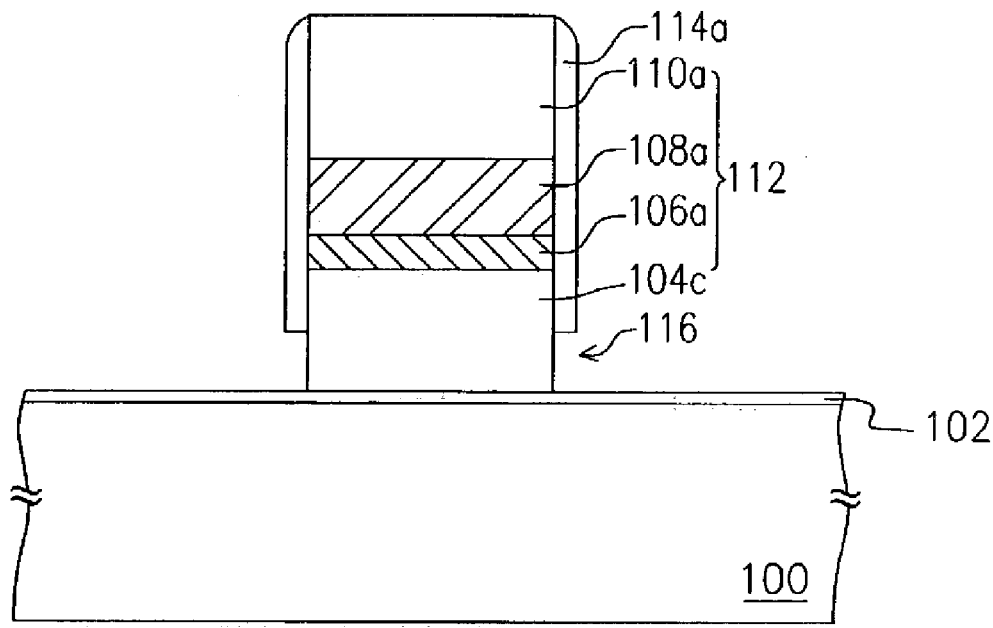

As shown in FIG. 1E, a portion of the exposed polysilicon layer 104b on the sidewalls of the stack structure 112 is removed to form a polysilicon layer 104c and a recess structure 116. The recess structure 116 is formed, for example, by dry etching or wet etching. A total thickness of between 25 Å to 300 Å of the polysilicon layer 104b is removed, for example. The stack structure 112 now comprises the polysilicon layer 104c, the metallic layer 106a, the metallic layer 108a and the insulation layer 110a.

Figure 1F:
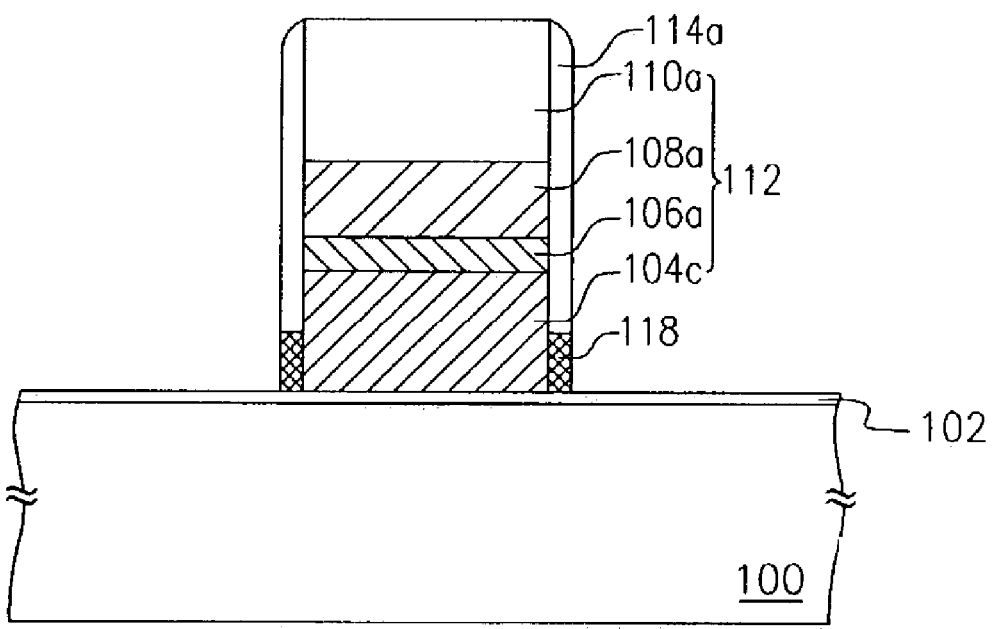

As shown in FIG. 1F, a re-oxidation process is conducted. The re-oxidation process repairs the gate dielectric layer 102 and forms a re-oxidation layer 118 that fills the recess structure 116. Since the insulation layer 110a and the spacers 114a enclose both the metallic layer 106a and the metallic layer 108a, no oxidation of the metallic layers occurs. Moreover, because the recess structure 116 is formed prior to conducting the re-oxidation process, the oxide layer 118 remains flush on the sides of the stack structure (gate structure) 112 without any protrusions.

In addition, rather than being enclosed by the spacers 114a, the contact area between the polysilicon layer 104c and the gate oxide layer 102 (that is, the corners of the gate structure) is exposed. Hence, the corner region of the gate structure is re-oxidized during the re-oxidation process and reliability of the device is ensured.

Figure 1G:
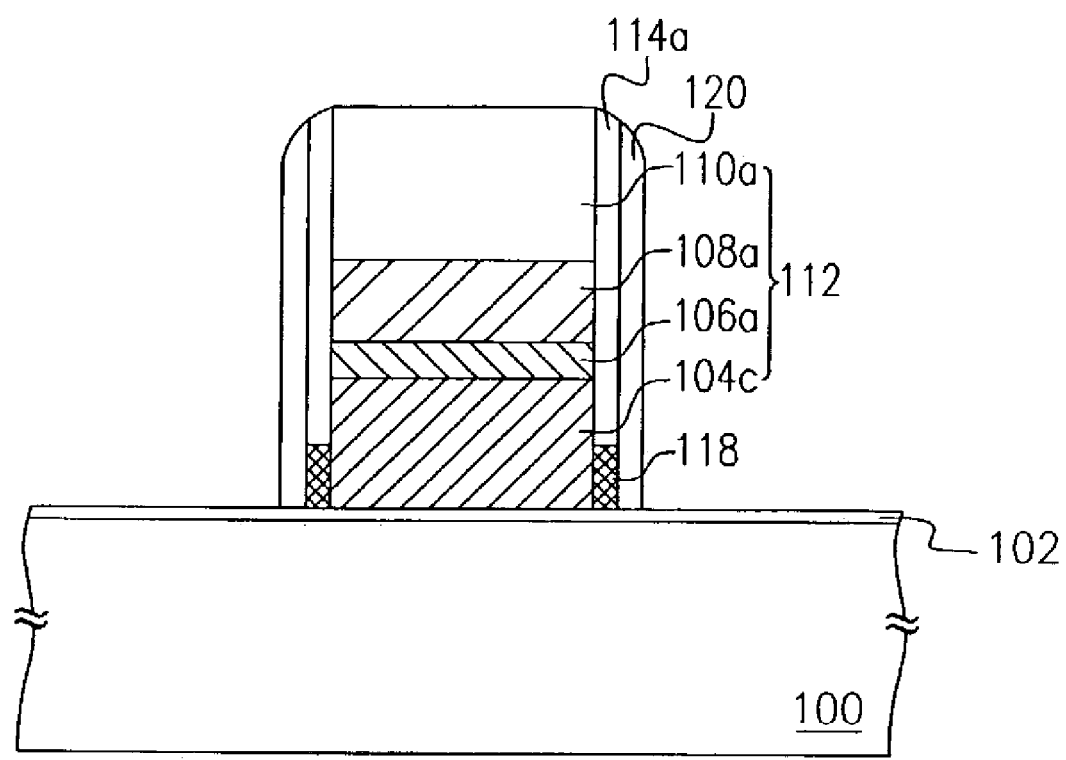

As shown in FIG. 1G, spacers 120 are formed on the sidewalls of the spacers 114a and the re-oxidation layer 118. This completes the fabrication of the gate structure. The spacers 120 are made from a material selected from a group including, for example, silicon nitride, silicon boron nitride and silicon oxynitride. The spacers 120 are formed, for example, by conducting a chemical vapor deposition to form a conformal barrier layer over the device and performing an anisotropic etching to remove a portion of the barrier layer until the gate oxide layer 120 is exposed.

The following is a description of the gate structure according to this invention. The gate structure is described with reference to FIG. 1G.

As shown in FIG. 1G, the gate structure according to this invention includes a substrate 100, a gate oxide layer 102, a polysilicon layer 104c, a metallic layer 106a, a metallic layer 108a, an insulation layer 110a, spacers 114a, a re-oxidation layer 118 and spacers 120. The gate oxide layer 102, the polysilicon layer 104c, the metallic layer 106a, the metallic layer 108a and the insulation layer 110a are sequentially stacked over the substrate 100. In fact, the polysilicon layer 104c, the metallic layer 106a, the metallic layer 108a and the insulation layer 110a together form a stack structure 112. The re-oxidation layer 118 is attached to the sidewall of the polysilicon layer 104c at the junction between the polysilicon layer 104c and the gate oxide layer 102. The spacers 114a are formed over areas on the sidewalls of the stack structure 112 not covered by the re-oxidation layer. In addition, the spacers 114a and the re-oxidation layer 118 on the sidewalls of the stack structure 112 have similar thickness. The spacers 120 are formed over the spacers 114a and the re-oxidation layer 118.

The steps for fabricating a gate structure according to this invention can also be applied to other types of gate structures as well. FIGS. 2 to 5 are schematic cross-section views of gate structures having a re-oxidation layer fabricated according to this invention. In FIGS. 2 to 5, components similar to the ones in FIG. 1G are labeled identically.

Figure 2:
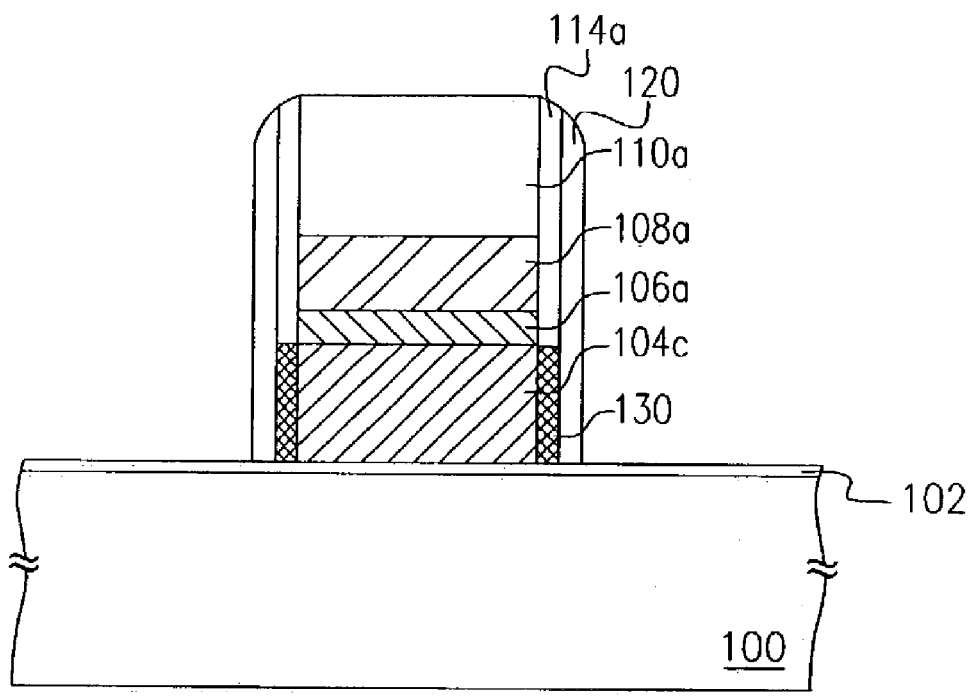
FIGS. 2 to 5 are schematic cross-section views of gate structures having a re-oxidation layer fabricated according to this invention.

In FIG. 2, the gate structure differs from the one in FIG. 1G in that the re-oxidation layer 130 covers the entire sidewalls of the polysilicon layer 104c. The method of forming such a re-oxidation layer 130 includes using the surface of the polysilicon layer 104 as an etching stop layer as shown in FIG. 1B and then forming the gate structure according to the steps as shown in FIGS. 1C to 1G.

Figure 3:
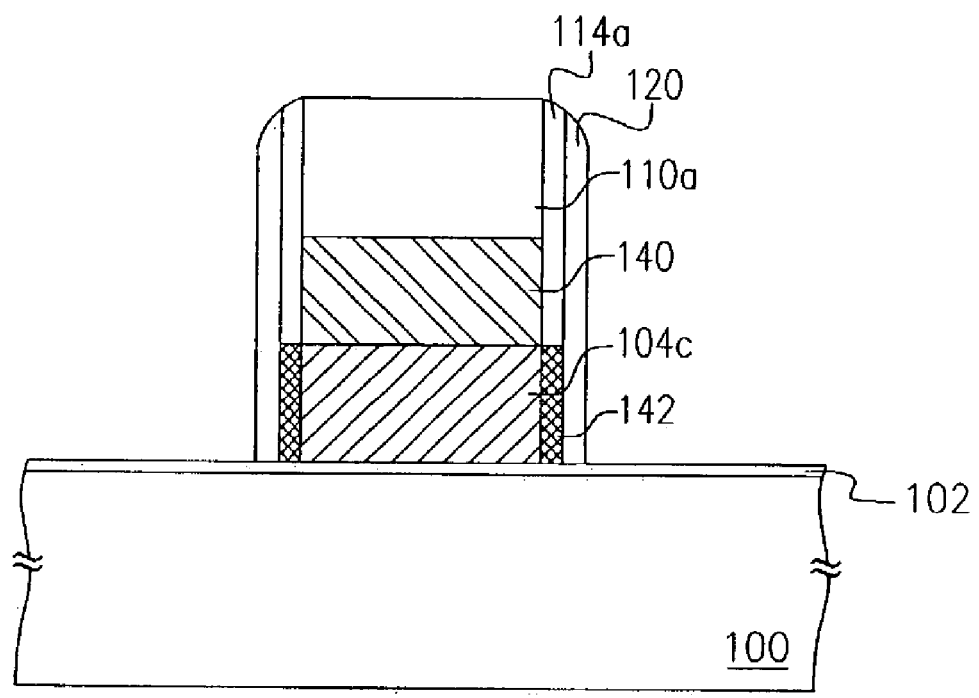

In FIG. 3, the gate structure is a polycide metal gate comprising a polysilicon layer 104c and a metal silicide layer 140. The method of re-oxidation is identical to the one in FIG. 2.

Figure 4:
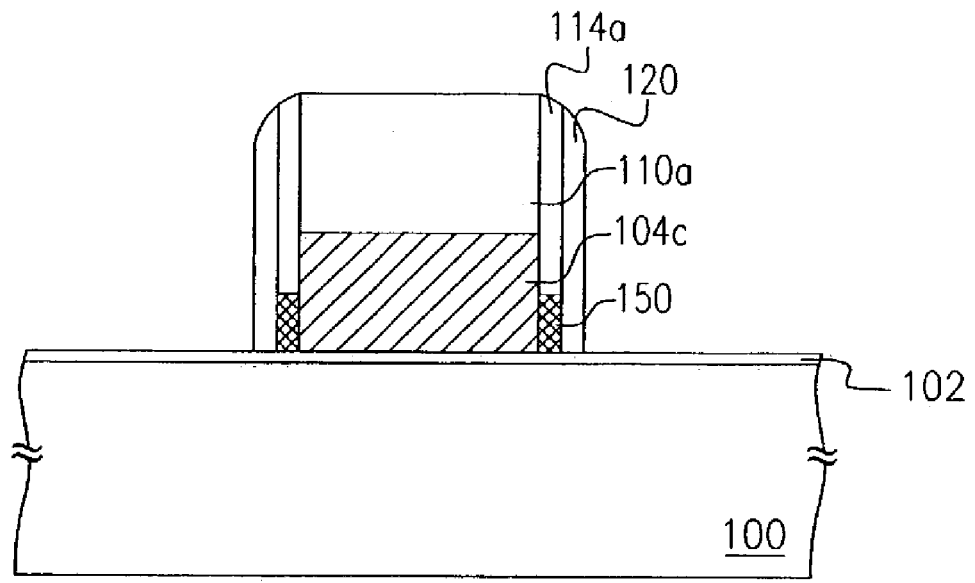

In FIG. 4, only the polysilicon layer 104c serves as a gate electrode. The re-oxidation layer 150 covers a portion of the sidewalls of the polysilicon layer 104c. The gate structure as shown in FIG. 4 is formed using the steps as shown in FIGS. 1B to 1G.

Figure 5:
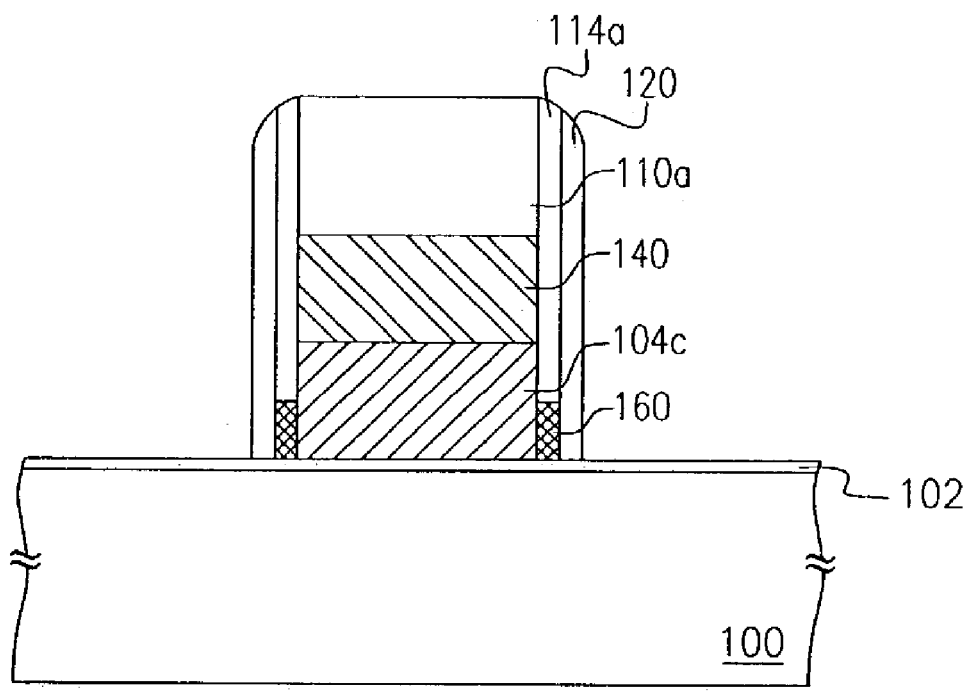

In FIG. 5, the gate structure is identical to the one shown in FIG. 3 and the oxide layer 160 covers a portion of the sidewalls of the polysilicon layer 104c. Similarly, the gate structure as shown in FIG. 5 is formed using the steps as shown in FIGS. 1B to 1G.

Accordingly, as long as the gate structure includes a polysilicon layer over a gate oxide layer and the various layers of material over the polysilicon layer are gathered into a stack, the gate structure can be applied widely in the fabrication of all types of gate structures. In other words, major aspects of this invention are the formation of a composite structure that includes first spacers, a re-oxidation layer and second spacers over the sidewalls of a gate structure.

In summary, the junctions between gate corners and the gate oxide layer are exposed prior to the re-oxidation process. Hence, oxidation at the junctions is ensured leading to greater device stability and reliability. Furthermore, a recess structure is formed on the sidewalls of the polysilicon layer prior to re-oxidation. Consequently, the gate can have a constant width and a subsequently formed contact opening can also have a constant width.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a gate structure, comprising the steps of:

providing a substrate;

sequentially forming a gate oxide layer, a polysilicon layer, a metallic layer and an insulation layer over the substrate;

patterning the insulation layer, the metallic layer and the polysilicon layer to form a stack structure using a set height level of the polysilicon layer as an etching end point;

forming a barrier layer over the stack structure;

conducting an etching operation to remove a portion of the sidewalls of the gate structure and form first spacers, continuing the etching operation to remove the polysilicon layer outside the first spacers until the gate oxide layer and the polysilicon layer on the sidewalls of the stack structure are exposed;

removing a portion of the exposed polysilicon layer on the sidewalls of the stack structure to form a recess structure;

conducting a re-oxidation process to form a re-oxidation layer inside the recess structure; and forming second spacers over the first spacers and the re-oxidation layer.

2. The method of claim 1, wherein the step of forming the recess structure includes conducting an isotropic dry etching.

3. The method of claim 1, wherein the step of forming the recess structure includes wet etching.

4. The method of claim 1, wherein the step of forming the metallic layer includes forming a barrier metallic layer and a refractory metallic layer in sequence.

5. The method of claim 4, wherein material constituting the refractory metallic layer includes tungsten.

6. The method of claim 4, wherein material constituting the barrier metallic layer is selected from a group consisting of titanium nitride and tungsten nitride.

7. The method of claim 1, wherein material constituting the first spacers and the second spacers is selected from a group consisting of silicon nitride, silicon boron nitride and silicon oxynitride.

* * * * *